US007603756B2

(12) United States Patent
Lim et al.

(10) Patent No.: US 7,603,756 B2
(45) Date of Patent: Oct. 20, 2009

(54) METHOD OF FORMING PIEZOELECTRIC ACTUATOR OF INKJET HEAD

(75) Inventors: Seung-mo Lim, Suwon-si (KR); Kyo-yeol Lee, Yongin-si (KR); Jae-woo Chung, Yongin-si (KR); Hwa-sun Lee, Suwon-si (KR); Jae-chang Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 229 days.

(21) Appl. No.: 11/583,798

(22) Filed: Oct. 20, 2006

(65) Prior Publication Data

US 2007/0186397 A1 Aug. 16, 2007

(30) Foreign Application Priority Data

Feb. 9, 2006 (KR) ...................... 10-2006-0012598

(51) Int. Cl.
*H04R 17/00* (2006.01)
*H01L 41/24* (2006.01)

(52) U.S. Cl. ....................... 29/25.35; 29/890.1; 347/70; 310/324

(58) Field of Classification Search ..... 29/25.25–25.42, 29/830–847, 890.1, 890.09; 347/20, 68–72, 347/94, 40; 310/328, 358, 365–366; 216/27
See application file for complete search history.

(56) References Cited

U.S. PATENT DOCUMENTS

| | | | | |
|---|---|---|---|---|
| 5,856,837 | A * | 1/1999 | Kitahara et al. | 347/70 |
| 6,494,566 | B1 * | 12/2002 | Kishino et al. | 347/70 |
| 7,121,650 | B2 * | 10/2006 | Chung et al. | 347/68 |
| 7,364,275 | B2 * | 4/2008 | Lim et al. | 347/70 |
| 2003/0016273 | A1 | 1/2003 | Sakamoto et al. | |
| 2004/0246313 | A1 * | 12/2004 | Lim et al. | 347/68 |
| 2007/0186397 | A1 * | 8/2007 | Lim et al. | 29/25.35 |

OTHER PUBLICATIONS

European Search Report issued Jan. 12, 2009 in European Application No. 06253465.6.

* cited by examiner

*Primary Examiner*—Minh Trinh
(74) *Attorney, Agent, or Firm*—Stanzione & Kim LLP

(57) ABSTRACT

A method of forming a piezoelectric actuator of an inkjet head formed on a vibrating plate to provide a driving power for ejecting ink to each of pressure chambers is provided. The method includes forming a lower electrode on a vibrating plate, forming a piezoelectric layer on the lower electrode to be located above each of pressure chambers, forming a protecting layer covering the lower electrode and the piezoelectric layer, exposing an upper surface of the piezoelectric layer by decreasing a thickness of the protecting layer and the piezoelectric layer, forming an upper electrode on the upper surface of the piezoelectric layer, removing the protecting layer. According to the present invention, since the piezoelectric layer having a flat upper surface is formed in uniform figure, area and thickness of the upper electrode formed thereon is uniformly controlled.

16 Claims, 5 Drawing Sheets

METHOD OF FORMING PIEZOELECTRIC ACTUATOR OF INKJET HEAD

CROSS-REFERENCE TO RELATED APPLICATIONS

This application claims the benefit of Korean Patent Application No. 10-2006-0012598, filed on Feb. 9, 2006, in the Korean Intellectual Property Office, the disclosure of which is incorporated herein in its entirety by reference.

BACKGROUND OF THE INVENTION

1. Field of the Invention

The present general inventive concept relates to an inkjet head, and more particularly, to a method of forming a piezoelectric actuator in a uniform shape, the piezoelectric actuator providing a driving force to eject ink from a piezoelectric inkjet head.

2. Description of the Related Art

Generally, inkjet heads are devices that can print a color image on a printing medium by ejecting droplets of ink onto a desired region of the printing medium. Depending on the ink ejecting method, the inkjet heads can be classified into two types: thermal inkjet heads and piezoelectric inkjet heads. The thermal inkjet head generates bubbles in the ink to be ejected by using heat and ejects the ink using expansion of the bubbles, and the piezoelectric inkjet head ejects ink using a pressure generated by deforming a piezoelectric material.

FIG. 1A is a sectional view illustrating a general structure of a conventional piezoelectric inkjet head, and FIG. 1B is a sectional view along a line A-A' of FIG. 1A.

Referring to FIG. 1A and FIG. 1B, a manifold 11, a plurality of restrictors 12, and a plurality of pressure chambers 13 are disposed in a flow channel plate 10 to form an ink flow channel. A vibrating plate 20, which becomes deformed by driving a piezoelectric actuator 40, is bonded to an upper surface of the flow channel plate 10. A nozzle plate 30, having a plurality of nozzles 31, is bonded to a lower surface of the flow channel plate 10. The flow channel plate 10 and the vibrating plate 20 may be integrally formed, and so may the flow channel plate 10 and the nozzle plate 30.

The manifold 11 is a passage that supplies ink flowing from an ink storage (not illustrated) to each of the pressure chambers 13, and the restrictor 12 is a passage through which ink flows from the manifold 11 into each of the pressure chambers 13. The pressure chambers 13 are arranged along one side or both sides of the manifold 11 to store the ink to be ejected. The nozzles 31 are formed by penetrating the nozzle plate 30 and are each connected to a respective one of the pressure chambers 13. The vibrating plate 20 is bonded to an upper surface of the flow channel plate 10 to cover the pressure chambers 13. The vibrating plate 20 is deformed by the operation of the piezoelectric actuator 40 to supply the pressure variation, to eject ink, to each of the pressure chambers 13. The piezoelectric actuator 40 includes a lower electrode 41, a piezoelectric layer 42, and an upper electrode 43, which are successively stacked on the vibrating plate 20. The lower electrode 41 is formed on a whole surface of the vibrating plate 20 to serve as a common electrode. The piezoelectric layer 42 is formed on the lower electrode 41 so as to be located above each of the pressure chambers 13. The upper electrode 43 is formed on the piezoelectric layer 42 to serve as a driving electrode to apply a voltage to the piezoelectric layer 42.

The piezoelectric actuator 40 of the conventional piezoelectric inkjet head is, generally, formed as described below. The lower electrode 41 is formed by depositing a predetermined metal material at a predetermined thickness on the vibrating plate 20 using a sputtering process. The piezoelectric layer 42 is formed by coating a ceramic material of a paste state having a piezoelectricity at a predetermined thickness on the lower electrode 41 using a screen-printing process, and sintering the same. The upper electrode 43 is formed by coating a conductive material on the piezoelectric layer 42 using a screen-printing process, and sintering the same.

However, since the conventional piezoelectric layer 42 formed by the screen-printing tends to spread laterally because of a property of the material of the paste state, it is difficult to form the conventional piezoelectric layer 42 in a uniform thickness. That is, a middle portion of the piezoelectric layer 42 is thick, while both edge portions of the piezoelectric layer 42 are thin, as illustrated in FIG. 1B. The upper electrode 43, which is formed on the piezoelectric layer 42 by a screen-printing process, also may not be uniform in shape, area, and thickness, due to a fluidity of the paste. Particularly, since a thickness of the piezoelectric layer 42 is not uniform, a distance between the upper electrode 43 and the lower electrode 41, which are formed respectively on the upper surface and the lower surface of the piezoelectric layer 42, is not uniform. Accordingly, an electric field formed between the upper electrode 43 and the lower electrode 41 is also not uniform. In addition, when the upper electrode 43 is formed on the thin edge portion of the piezoelectric layer 42, an interval between the upper electrode 43 and the lower electrode 41 becomes a lot smaller, so that the upper electrode 43 and the lower electrode 41 may be shorted. Moreover, a paste may flow down along a curved surface of the piezoelectric layer 42 and directly contact the lower electrode 41 in the forming process of the upper electrode 43, leading to a defective piezoelectric actuator 40.

As described above, the conventional method of the piezoelectric actuator 40 cannot control formation of a uniform width, area, and thickness etc., of the upper electrode 43.

SUMMARY OF THE INVENTION

The present general inventive concept provides a method of forming a piezoelectric actuator of an inkjet head that can uniformly control a formation of an upper electrode and can prevent a short-circuit between the upper electrode and a lower electrode.

Additional aspects and advantages of the present general inventive concept will be set forth in part in the description which follows and, in part, will be obvious from the description, or may be learned by practice of the general inventive concept.

The foregoing and/or other aspects and utilities of the present general inventive concept are achieved by providing a method of forming a piezoelectric actuator of an inkjet head formed on a vibrating plate to provide a driving force to eject an ink to each of a plurality of pressure chambers, the method including forming a lower electrode on the vibrating plate, forming a piezoelectric layer on the lower electrode to correspond to each of the plurality of pressure chambers; forming a protecting layer covering the lower electrode and the piezoelectric layer; exposing an upper surface of the piezoelectric layer by decreasing a thickness of the protecting layer and the piezoelectric layer; forming an upper electrode on the upper surface of the piezoelectric layer; and removing the protecting layer.

A silicon oxide layer or a silicon nitride layer may be formed as an insulating layer between the vibrating layer and the lower electrode.

The lower electrode may be formed by depositing a conductive metal material at a predetermined thickness. The lower electrode may be formed by sequentially depositing a Ti layer and a Pt layer using a sputtering process.

The piezoelectric layer may be formed by coating a piezoelectric material of a paste state using a screen-printing process. The forming of the piezoelectric layer may include drying and sintering the piezoelectric layer of a paste state. A cold isostatic press (CIP) process may be performed to densify a construction of the dried piezoelectric layer.

The protecting layer may be formed of an organic material selected from a group of a polydimethylsiloxane (PDMS), a polymethylmethacrylate (PMMA) and a photosensitive polymer. The protecting layer may be formed by coating the organic material using a spin coating process.

A thickness of the protecting layer and the piezoelectric layer may be decreased by a chemical-mechanical polishing (CMP) process or a lapping process.

The upper electrode may be formed by coating an electrode material of a paste state on the piezoelectric layer using a screen-printing process. The forming of the upper electrode may be performed by drying and sintering the upper electrode of a paste state.

The upper electrode may be formed by depositing a conductive material at a predetermined thickness on the piezoelectric layer by a sputtering process.

The protecting layer may be removed by an $O_2$ ashing or by using a sulphuric acid solution or an acetone.

The foregoing and/or other aspects and utilities of the present general inventive concept may also be achieved by providing a method of forming a piezoelectric actuator of an inkjet head formed on a vibrating plate, the method including forming a lower electrode on the vibrating plate; forming a piezoelectric layer in a predetermined pattern on the lower electrode to correspond with a plurality of pressure chambers to contain ink therein; forming a protecting layer covering the lower electrode and the piezoelectric layer pattern; etching the protecting layer and a portion of the piezoelectric layer pattern to a predetermined thickness to expose the piezoelectric layer pattern within a same plane with the protecting layer; and forming an upper electrode above the etched region to correspond with the exposed piezoelectric layer pattern.

The foregoing and/or other aspects and utilities of the present general inventive concept may also be achieved by providing a method of forming a piezoelectric actuator of an inkjet head formed on a vibrating plate, the method including forming a lower electrode on the vibrating plate; forming a piezoelectric layer in a predetermined pattern on the lower electrode to correspond with a plurality of pressure chambers to contain ink therein; etching the formed piezoelectric layer to a predetermined thickness; and forming an upper electrode on the etched piezoelectric layer pattern and corresponding with the predetermined pattern.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1A:
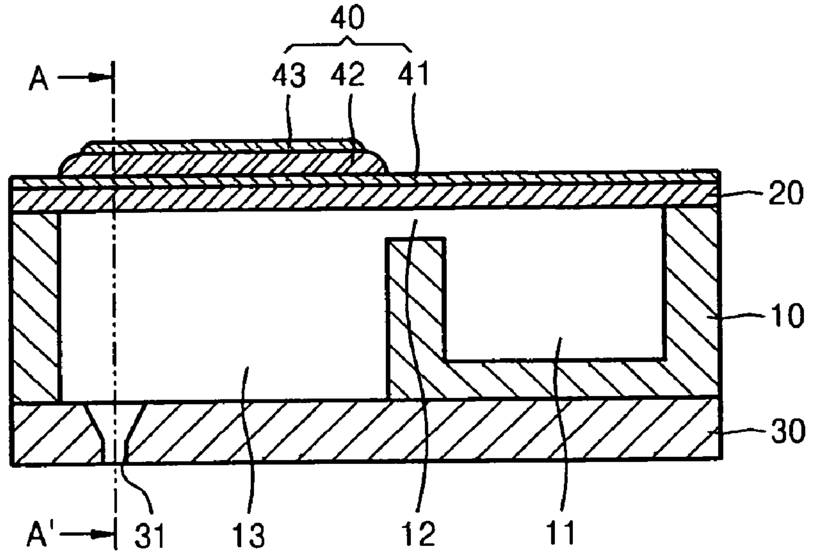
FIG. 1A (PRIOR ART)
FIG. 1A is a sectional view illustrating a general structure of a conventional piezoelectric inkjet head.
Figure 1B:
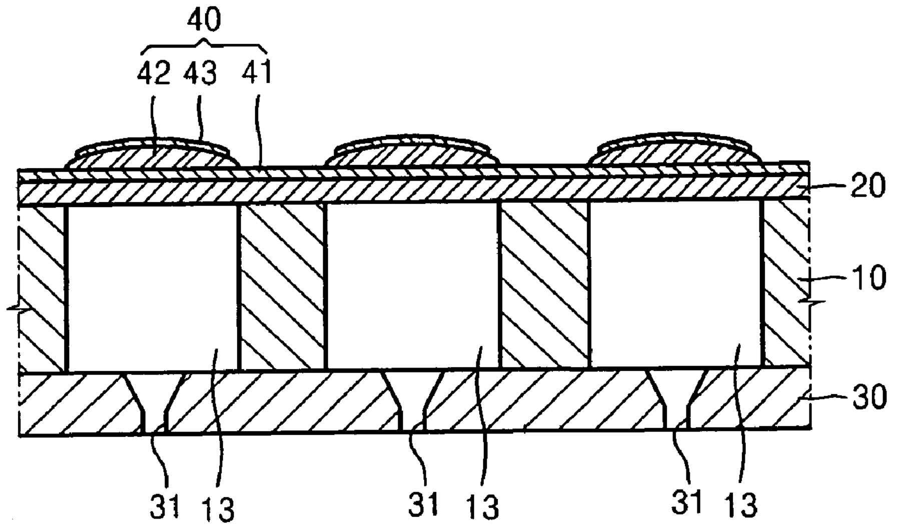
FIG. 1B (PRIOR ART)
FIG. 1B is a sectional view along a line A-A' of FIG. 1A.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 2A through FIG. 2F are views sequentially illustrating a method of forming a piezoelectric actuator of an inkjet head according to an embodiment of the present general inventive concept. The drawings illustrate a part of the inkjet head, and generally, several tens or hundreds of pressure chambers and nozzles are arranged along one line or a plurality of lines in an inkjet head.

Figure 2A:
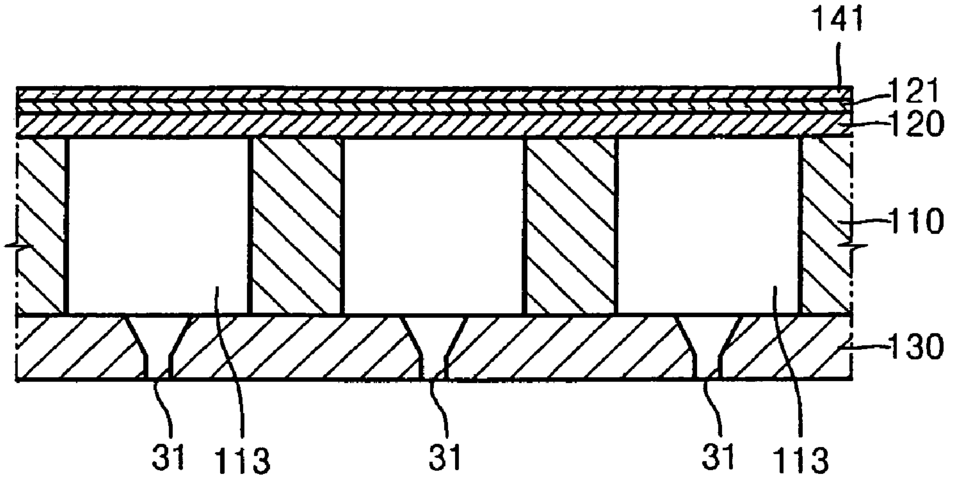
FIG. 2A through FIG. 2F is a view sequentially illustrating a method of forming a piezoelectric actuator of an inkjet head according to an embodiment of the present general inventive concept.

Referring to FIG. 2A, a piezoelectric inkjet head may include an ink flow channel, which may be formed on plates, for example, a flow channel plate 110, a vibrating plate 120, and a nozzle plate 130. A plurality of pressure chambers 113 are formed between the flow channel plates 110 of the inkjet head. The vibrating plate 120 is bonded to an upper surface of the flow channel plates 110 to cover the pressure chambers 113, and the nozzle plate 130, through which a plurality of nozzles 31 are formed, is bonded to a lower surface of the flow channel plates 110. A manifold and a plurality of restrictors (not illustrated) may also be formed between the flow channel plates 110. The flow channel plates 110 and the vibrating plate 120 may be integrally formed, and so may the flow channel plates 110 and the nozzle plate 130.

A piezoelectric actuator 140 (see FIG. 2F) is formed on the vibrating plate 120 of the inkjet head by processes described below. The piezoelectric actuator 140 provides a driving force to eject ink to each of the pressure chambers 113 by deforming the vibrating plate 120.

As illustrated in FIG. 2A, a lower electrode 141 is formed on a whole surface of the vibrating plate 120 to serve as a common electrode. An insulating layer 121 to provide insulation between the lower electrode 141 and the vibrating plate 120 may be formed on a whole surface of the vibrating plate 120 before forming the lower electrode 141. In this case, the lower electrode 141 is formed on a whole surface of the insulating layer 121. When the vibrating plate 120 is formed of a silicon substrate, the insulating layer 121 may be formed of a silicon oxide layer or a silicon nitride layer.

The lower electrode 141 may be formed by depositing a conductive metal material at a predetermined thickness on a whole surface of the vibrating plate 120 or the insulating layer 121. For example, the lower electrode 141 may be formed of one metal layer or two metal layers consisting of a Ti layer and a Pt layer. When the lower electrode 141 is formed of the two layers, the Ti layer may be formed approximately 400 Å thick by a sputtering process, and the Pt layer may be formed approximately 5000 Å thick also by a sputtering process.

Figure 2B:
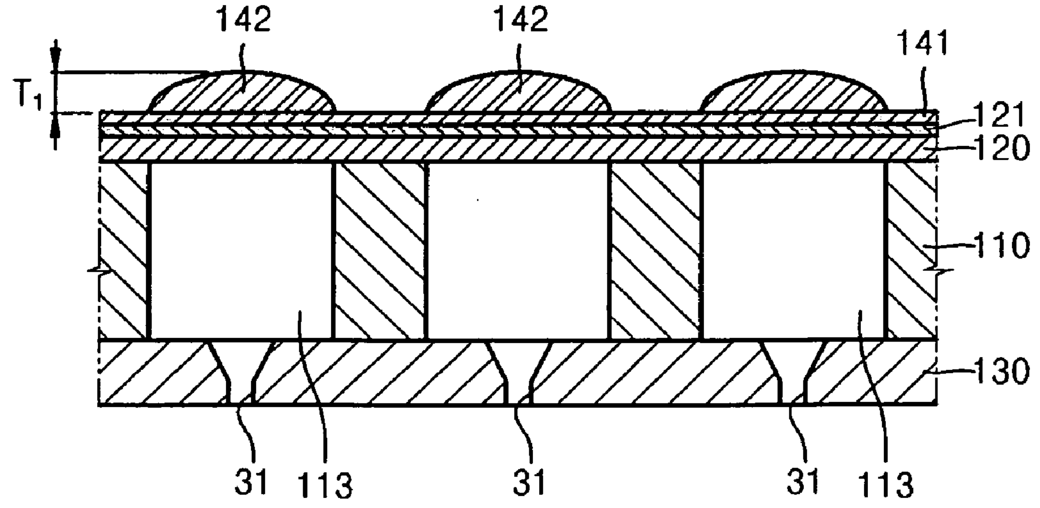

Next, as illustrated in FIG. 2B, a piezoelectric layer 142 is formed on the lower electrode 141 to be located above each of the pressure chambers 113. The piezoelectric layer 142 may be formed by coating a piezoelectric material of a paste state, for example, a lead ziroconate titanate (PZT) ceramic material, to a predetermined thickness using a screen-printing process. A thickness T1 of the piezoelectric layer 142 may be thicker than a final thickness T2 in FIG. 2D of the piezoelectric layer 142, for example, approximately 50 μm thick. Next, the piezoelectric layer 142 of a paste state is dried, and then sintered at approximately 900° C.~1200° C. A cold isostatic press (CIP) process may be performed on the piezoelectric layer 142 of a paste state before the sintering. The CIP process is a process of densifying a construction by applying a same pressure to the piezoelectric layer 142 from all directions.

Figure 2C:
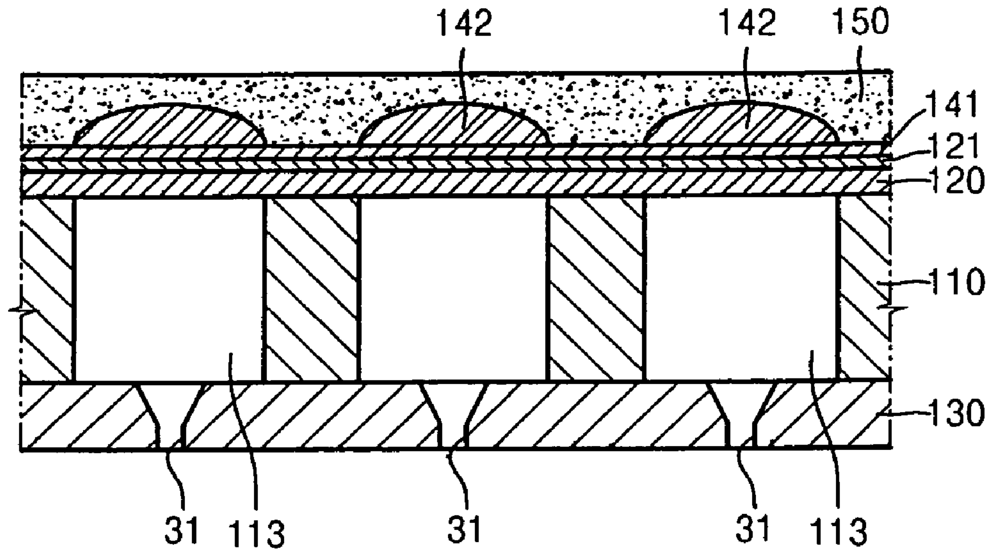

Next, as illustrated in FIG. 2C, a protecting layer 150 is formed to cover the lower electrode 141 and the piezoelectric layer 142. An organic material removable after being solidified from a liquid state, for example, a polydimethylsiloxane (PDMS), a polymethylmethacrylate (PMMA), or a photosensitive polymer such as photoresist, may be used as the protecting layer 150. The protecting layer 150 may be formed by coating the removable material (such as the organic material) using a spin coating process.

Figure 2D:
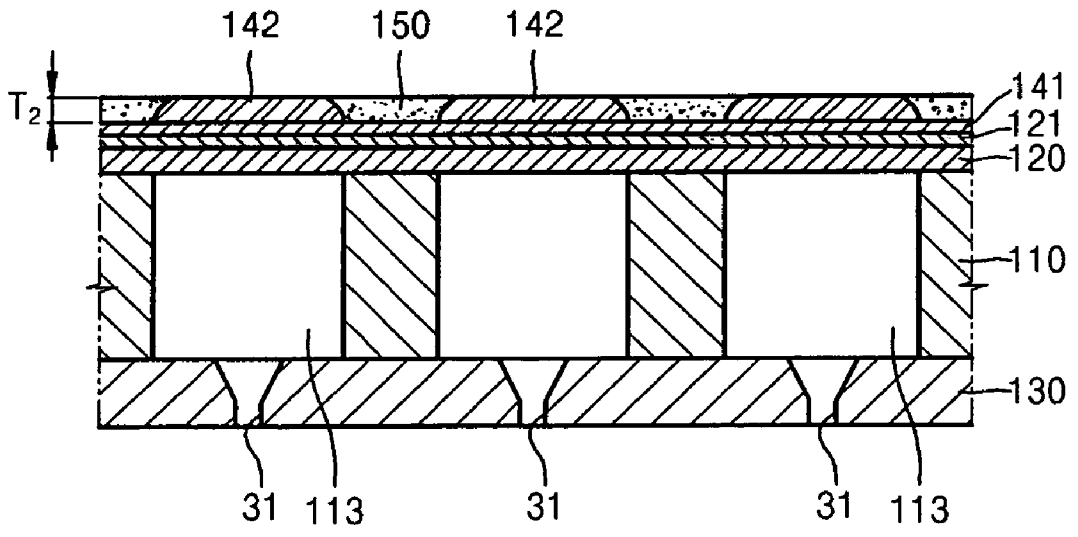

Next, as illustrated in FIG. 2D, thicknesses of the piezoelectric layer 142 and the protecting layer 150 are decreased to a desired thickness T2, for example, approximately 10-30 μm. A final thickness T2 of the piezoelectric layer 142 may be varied depending on a size of the pressure chamber 113 and a thickness of the vibrating plate 120. The decreasing of thicknesses of the piezoelectric layer 142 and the protecting layer 150 may be performed by a chemical-mechanical polishing (CMP) process or a lapping process.

After the above operations are completed, the piezoelectric layer 142 having the uniform thickness T2 and a flat upper surface is completely formed on the vibrating plate 120. When the piezoelectric layer 142 has the uniform thickness T2, a distance between an upper electrode 143 as illustrated in FIG. 2E and the lower electrode 141, which are formed respectively above and below the piezoelectric layer 142, is uniform, so that a uniform electric field is formed.

Figure 2E:
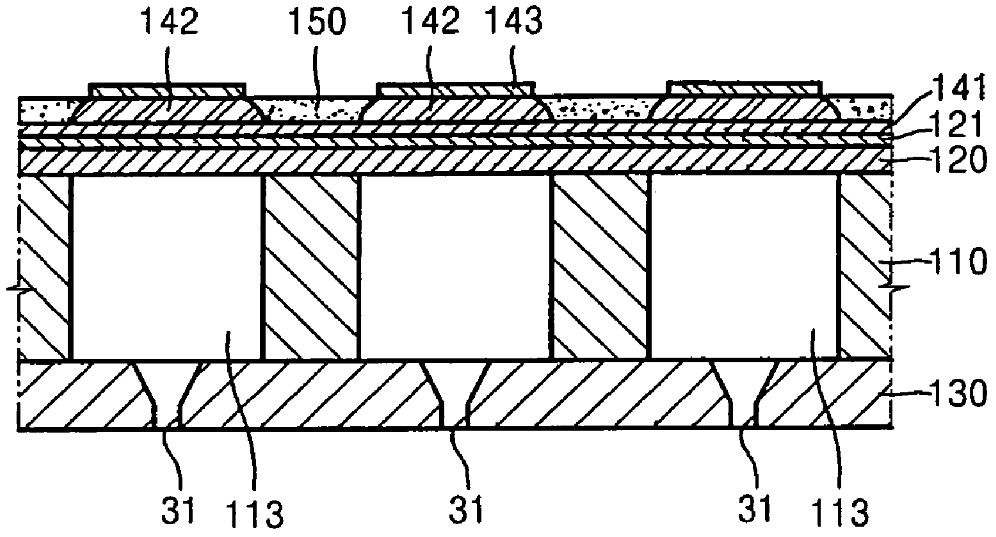

Referring to FIG. 2E, the upper electrode 143 is formed on an exposed upper surface of the piezoelectric layer 142, as illustrated in FIG. 2D, to serve as a driving electrode. The upper electrode 143 may be formed by screen-printing an electrode material, for example, an Ag—Pd paste, on the piezoelectric layer 142, and then drying the same and sintering the same at a temperature range of approximately 100-400° C.

As described above, according to an embodiment of the present general inventive concept, the upper electrode 143 is formed in a state where the upper surface of the piezoelectric layer 142 is exposed and the upper surface of the lower electrode 141 is covered with the protecting layer 150. Therefore, the upper electrode 143 and the lower electrode 141 are prevented from being shorted as a fluidity of the paste of the upper electrode 143 is prevented. Also, since the upper surface of the piezoelectric layer 142 is flat, it is easy to form the upper electrode 143 to a uniform thickness. In addition, since only the upper surface of the piezoelectric layer 142 is exposed at the time of forming the upper electrode 143, although the electrode material is coated on the protecting layer 150 out of the range of the upper surface of the piezoelectric layer 142, the electrode material coated on the protecting layer 150 is removed along with the removal of the protecting layer 150, thereby forming the upper electrode 143 having a uniform area and shape.

In another embodiment of the present general inventive concept, an upper electrode 143 may be formed by depositing the electrode material at a predetermined thickness on the piezoelectric layer 142 by using a sputtering process, which will be described below with reference to FIG. 3.

Figure 2F:
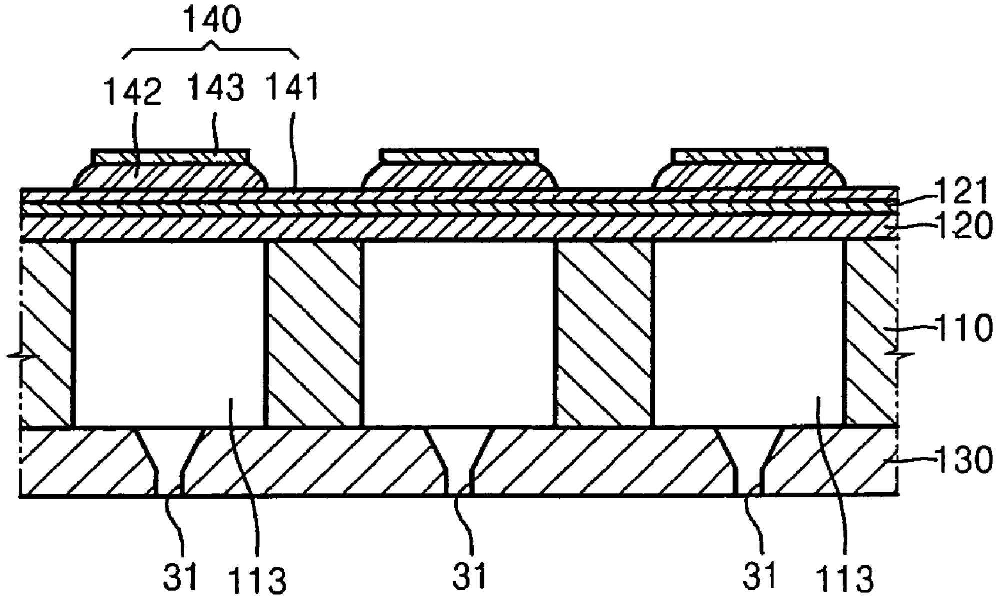

The protecting layer 150 remaining on the lower electrode 141 is removed, so that the piezoelectric actuator 140 including the lower electrode 141, the piezoelectric layer 142 and the upper electrode 143, sequentially stacked, is formed as illustrated in FIG. 2F. The protecting layer 150 may be removed by various known methods, for example, by an $O_2$ ashing process or by using a sulphuric acid solution or an acetone, depending on the type of the material used to form the protecting layer 50.

Figure 3:
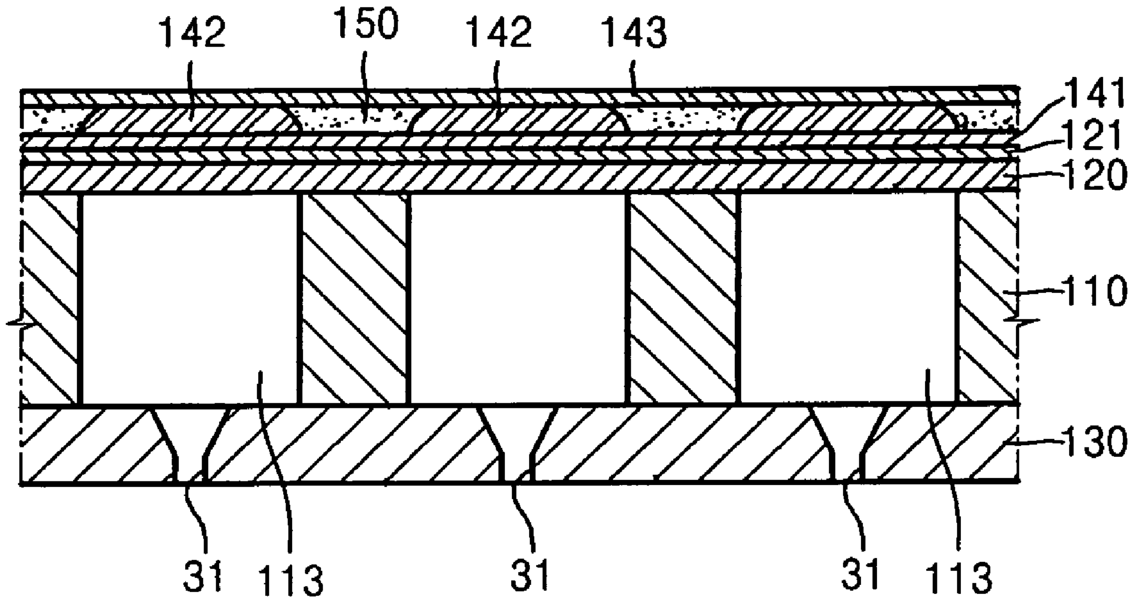
FIG. 3 is a view illustrating another embodiment of the forming operation of an upper electrode illustrated in FIG. 2E.

FIG. 3 is a view illustrating another embodiment of forming the upper electrode in FIG. 2E.

Referring FIG. 3, the upper electrode 143 may be formed by depositing a metal material, for example, a conductive metal material, such as Au or Pt, at a predetermined thickness on the exposed upper surface of the piezoelectric layer 142 illustrated in FIG. 2D using a sputtering process. At this time, the upper electrode 143 is formed on the protecting layer 150 as well as the piezoelectric layer 142. Subsequently, when the protecting layer 150 is removed as descried above, the upper electrode 143 deposited on the protecting layer 150 is lifted off and removed together with the protecting layer 150, and only the upper electrode 143 deposited on the piezoelectric layer 142 remains, as illustrated in FIG. 2F.

As described above, according to the method of forming the piezoelectric actuator of the inkjet head of the present general inventive concept, since the piezoelectric layer having a flat upper surface is formed to a uniform thickness, a shape, area, and thickness of the upper electrode formed thereon is uniformly controlled. Therefore, a distance between the upper electrode and the lower electrode is uniform, so that a uniform electric field is formed. Also, the upper electrode and the lower electrode are prevented from being shorted due to a fluidity of a paste.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of forming a piezoelectric actuator of an inkjet head formed on a vibrating plate to provide a driving force to eject an ink to each of a plurality of pressure chambers, the method comprising:

forming a lower electrode on the vibrating plate;

forming a piezoelectric layer on the lower electrode to correspond to each of the plurality of pressure chambers;

forming a protecting layer covering the lower electrode and the piezoelectric layer;

exposing an upper surface of the piezoelectric layer by decreasing a thickness of the protecting layer and the piezoelectric layer;

forming an upper electrode on the upper surface of the piezoelectric layer; and removing the protecting layer.

2. The method of claim 1, wherein an insulating layer is formed between the vibrating layer and the lower electrode.

3. The method of claim 2, wherein the insulating layer is a silicon oxide layer or a silicon nitride layer.

4. The method of claim 1, wherein the lower electrode is formed by depositing a conductive metal material at a predetermined thickness.

5. The method of claim 4, wherein the lower electrode is formed by sequentially depositing a Ti layer and a Pt layer by a sputtering process.

6. The method of claim 1, wherein the piezoelectric layer is formed by coating a piezoelectric material of a paste state by a screen-printing process.

7. The method of claim 6, wherein the forming of the piezoelectric layer comprises drying and sintering the piezoelectric material of the paste state.

8. The method of claim 7, wherein a cold isostatic press process is performed to densify a construction of the dried piezoelectric layer after drying the piezoelectric material of the paste state.

9. The method of claim 1, wherein the protecting layer is formed of an organic material selected from a group of a polydimethylsiloxane, a polymethylmethacrylate and a photosensitive polymer.

10. The method of claim 9, wherein the protecting layer is formed by coating the organic material via a spin coating process.

11. The method of claim 1, wherein a thickness of the protecting layer and the piezoelectric layer is decreased via a chemical-mechanical polishing process or a lapping process.

12. The method of claim 1, wherein the upper electrode is formed by coating an electrode material of a paste state on the piezoelectric layer via a screen-printing process.

13. The method of claim 12, wherein the forming of the upper electrode comprises drying and sintering the upper electrode of a paste state.

14. The method of claim 1, wherein the upper electrode is formed by depositing a conductive material at a predetermined thickness on the piezoelectric layer by a sputtering.

15. The method of claim 1, wherein the protecting layer is removed by an $O_2$ ashing.

16. The method of claim 1, wherein the protecting layer is removed using a sulphuric acid solution or an acetone.

* * * * *